(12) United States Patent
Ferianz et al.

(10) Patent No.: US 7,633,276 B2
(45) Date of Patent: Dec. 15, 2009

(54) SWITCHING CONTROL IN DC-DC-CONVERTERS

(75) Inventors: Thomas Ferianz, Bodensdorf (AT); Maria Giovanna Lagioia, Villach (AT); Joachim Pichler, Landskron (AT); Robert Piskernik, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 252 days.

(21) Appl. No.: 11/737,795

(22) Filed: Apr. 20, 2007

(65) Prior Publication Data
US 2008/0259648 A1 Oct. 23, 2008

(51) Int. Cl.
*G05F 1/40* (2006.01)
*G05F 1/10* (2006.01)

(52) U.S. Cl. .................. 323/271; 323/222

(58) Field of Classification Search ............ 323/222, 323/223, 225, 268, 271, 272, 282, 320, 321, 323/325, 327, 349–351
See application file for complete search history.

(56) References Cited

U.S. PATENT DOCUMENTS

| 6,946,820 B2* | 9/2005 | Ishii et al. .............. 323/222 |
| 7,332,897 B2* | 2/2008 | Lee et al. .............. 323/222 |
| 7,433,209 B2* | 10/2008 | Chan et al. ............ 363/21.02 |

* cited by examiner

*Primary Examiner*—Matthew V Nguyen
(74) *Attorney, Agent, or Firm*—SpryIP, LLC (57) ABSTRACT

A switching control circuit for a DC-DC converter comprises an input terminal to receive input signals and an output terminal to couple the switching control circuit to a switch of the DC-DC converter. A quasi-static supply path is coupled to the input terminal to receive first signals based on the input signals and coupled to the output terminal to provide output signals to the output terminal based on the input signals. A dynamic supply path is coupled to the input terminal to receive second signals based on the input signals in-phase with the first signals and coupled to the output terminal to provide output signals to the output terminal based on the input signals.

29 Claims, 5 Drawing Sheets

SWITCHING CONTROL IN DC-DC-CONVERTERS

BACKGROUND

DC-DC converters are devices converting an input voltage at a first level to an output voltage at a second level. Typically although not necessary, the first and second level may be different. Depending on the specific type of a conversion circuit, DC-DC converters may be able to up-convert DC voltages also referred to as step-up converters or boost converters, down convert DC voltages also referred to as step-down converters or buck converters or up-convert or down-convert also referred to as buck boost converters. Furthermore, DC-DC converters may be distinguished whether the output voltage is reversed or not-reversed compared to the input voltage, the former type being referred to as inverting converters. In DC-DC converters, an inductive element or inductor is used for storing and releasing energy. Current is provided to the inductive element dependent on the control of a switch.

DETAILED DESCRIPTION

The following detailed description explains exemplary embodiments of the present invention. The description is not to be taken in a limiting sense, but is made only for the purpose of illustrating the general principles of embodiments of the invention. In the various embodiments, identical or similar elements may be denoted with same reference signs.

Figure 1:
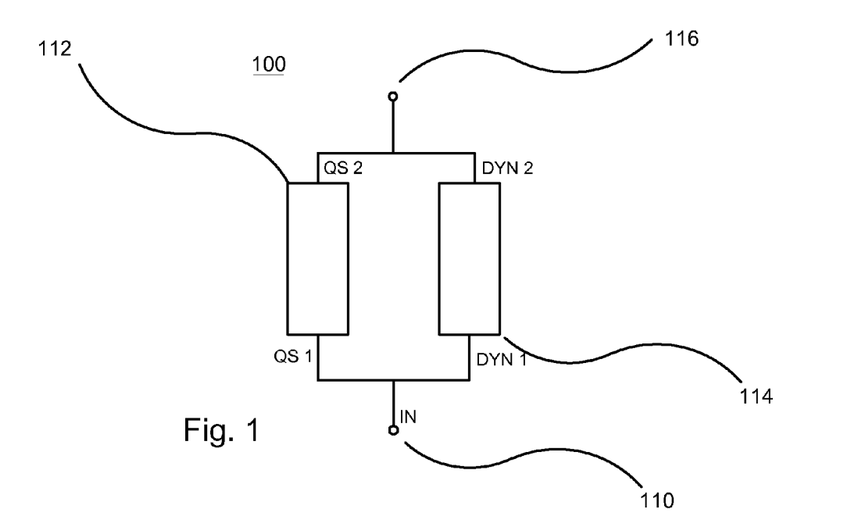
FIG. 1 shows a block diagram according to an embodiment of the present invention.

FIG. 1 shows an exemplary embodiment of a control circuit 100 to control a switch of a DC-DC converter. The control circuit 100 comprises an input terminal 110 to receive control signals IN from a signal source. The switching control circuit 100 comprises a quasi-static supply path 112 coupled at a first end to the input terminal 110 to receive signals QS1 based on the input signals IN. The quasi-static supply path 112 is coupled at a second end to an output terminal 116 to provide signals QS2 to the output terminal 116 in order to supply quasi-static supply signals to a switch of a DC-DC converter.

The control circuit 100 further comprises a dynamic supply path 114 coupled at a first end to the input terminal 110 to receive signals DYN1 based on the input signals received at terminal 110 and in-phase with the signals QS1. The dynamic supply path 114 is coupled at a second end to output terminal 116 to provide signals DYN2 to the output terminal 116 to supply dynamic supply signals to a switch of a DC-DC converter. According to one embodiment, the dynamic supply path 114 may comprise a capacitor to provide dynamic supply signals to the switch of the DC-DC converter.

The dynamic supply signals DYN2 are provided by the dynamic supply path for dynamic switching of the DC-DC converter's switch. Thus, the signals DYN2 are provided immediately or almost immediately upon applying the switching signals to the DC-DC converter's switch while the quasi-static supply path needs additional time in order to establish operation for providing the output signal.

While the quasi-static supply path may according to embodiments require a longer transition time upon applying the signals at the terminal 110, the driving force of the quasi-static supply path is capable to maintain the switch open or closed for time intervals at least longer than the dynamic supply path 114 is capable of providing driving force to the switch of the DC-DC converter. Thus, the quasi-static supply signals drive the switch in order to maintain the switching state until the input signal indicates a next transition of the switching state. According to embodiments, the time period of the input signals IN between a first switching indication, for example an indication to close the switch, and a second switching indication, for example an indication to open the switch, may be within a region from 100 ns to 1 ms. Thus, in the above embodiments, the quasi-static supply path drives the switch at least as long as the required time periods which may be for example between 100 ns and 1 ms. However, in other embodiments, the quasi-static supply signals QS2 may be provided to maintain the switching states for shorter time periods than 100 ns or longer time periods than 1 ms. According to embodiments, the switching may be indicated by transitions of the input signals IN.

The input terminal 110 may be implemented as a single pin, the single pin receiving the signals indicating switching-on or switching-off the DC-DC converter switch. Thus, the amount of pins of the control circuit 100 are reduced allowing a less complex circuitry and allowing to provide the signals to the input terminal 110 by a single driver. According to embodiments, the signals QS1 and DYN1 are provided in-phase based on a same input signal to the quasi-static and dynamic supply path.

The quasi-static supply path 112 may comprise at least one active component such as at least one transistor to supply quasi-static switching signals to a switch of a DC-DC converter. According to embodiments, the quasi-static supply path 112 may comprise only a single transistor. The transistor may be a bipolar transistor, i.e. a npn transistor or a pnp transistor.

Furthermore, the bipolar transistor may be provided according to embodiments in a base circuit configuration, i.e. the base of the bipolar transistor may be coupled to a terminal supplying a fixed potential to the base.

According to embodiments, the dynamic supply path 114 may comprise only one or more passive elements, such as a capacitor. The dynamic supply path 114 may allow for supplying the dynamic supply signals DYN2 without time delay to the output terminal 116 for driving the switch either in a closed or open state.

In embodiments, the dynamic supply path may 114 comprise a single capacitor having a first electrode connected to the input terminal and having a second electrode connected to the output terminal. For example, according to embodiments, the first electrode and the input terminal may be coupled to a first node and a first resistor may be provided between the first node and a second node wherein the further terminal (collector or emitter) of the bipolar transistor is coupled to the second node. Furthermore a second resistor may be provided between the second node and a first common potential terminal.

In addition, other semiconductor elements or passive elements may be provided in the quasi-static supply path or may be coupled to the quasi static supply path. For example, a resistor may be arranged between the input terminal 110 and a further terminal of a bipolar transistor, i.e. emitter or collector terminal of the bipolar transistor. According to embodiments, the resistor may be arranged between a first and second node, wherein the first node is coupling the resistor in the quasi-static supply path and the first electrode of the capacitor in the dynamic supply path to the input terminal 110. According to this embodiment, the second node is coupled to a terminal (emitter or collector) of the bipolar transistor and to second common potential, for example ground, via a second resistor.

In FIG. 1, the quasi-static and dynamic supply path are shown to be directly connected to the input terminal 110 and the output terminal 116 in a parallel configuration. According to other embodiments, coupling of the quasi-static supply path 112 and the dynamic supply path 114 to the input terminal in many other ways, for example via one or more networks coupling the input terminal 110 to the quasi-static supply path 112 and the dynamic supply path 114 to provide the signals QS1 and DYN1 in-phase to the paths 112 and 114. Furthermore, according to embodiments, one or more networks may be provided to couple the output terminal 116 to the quasi-static supply path 112 and the dynamic supply path 114. It is further to be understood that other components such as filters, interfaces, etc. may be provided in the control circuit 100.

Figure 2:
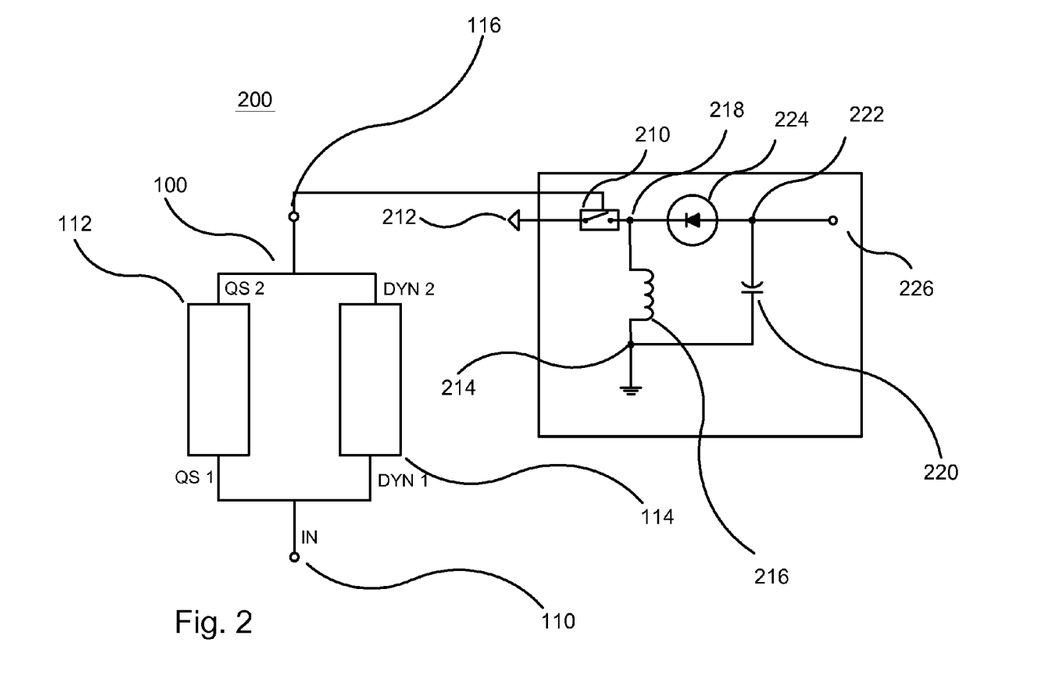
FIG. 2 shows a block diagram according to an embodiment of the present invention.

FIG. 2 shows a DC-DC converter 200 according to an exemplary embodiment. The DC-DC converter 200 comprises the control circuit 100 as described above with respect to FIG. 1 to control a switch 210 provided within a conversion circuit of the DC-DC converter to regulate current flow within the DC-DC converter. To this end, the output terminal 116 of the control circuit 100 is coupled to a control terminal of the switch 210.

In the conversion circuit, a first terminal of the switch 210 is coupled to an input terminal 212 of the DC-DC converter to input a first DC voltage between the input terminal 212 and ground. An inductor 216 is coupled at a first end to a first electrode of a capacitor 220 via a node 214 connected to ground. The inductor 216 is coupled at a second end via a node 218 to a second terminal of the switch 210. A second electrode of the capacitor 220 is coupled via a node 222 to an anode of a diode 224. A cathode of the diode 224 is coupled to the node 218. An output terminal 226 of the DC-DC converter is coupled to the node 222 to provide an output DC voltage between the output terminal 226 and ground.

While the above described DC-DC converter is of the Buck-Boost type, it is to be understood that DC-DC converter 200 may also be of any other DC-DC converter type including but not limited to Buck converters, Boost converters, Buck-boost converters, inverting converters etc. It is to be understood that for each type of DC-DC converter many modification and circuit arrangements may be provided in order to address the different types or operations of DC-DC converters. For example, in the conversion circuit, inductor 216 may be replaced by a transformator, capacitor 220 may be replaced by a capacitor network etc. It is furthermore to be noted that in embodiments of the present invention, the switch 210 may comprise other types of transistors, for example a bipolar transistor, field-controlled transistor, an IGBT (isolated gate bipolar transistors), a BJT or combinations thereof.

With respect to FIG. 3, an exemplary operation of the control circuit 100 will now be described.

Referring to S10, an input signal is received at the input terminal 110 of the control circuit 100. The input signal may be supplied to the input terminal by a driver which may be arranged on the same chip or on the same board as the control circuit 100 or external of the control circuit's chip or external of the control circuit's board. The input signal may be of any waveform including but not limited to a square waveform, a saw tooth waveform, a sinus waveform etc. The driver may vary the duty of the signals provided to input terminal 110 in order to adjust the output level of the DC-Dc converter.

In S20, a first signal DYN1 based on the input signal is provided to the dynamic supply path 114. The dynamic supply path provides a dynamic control signal to the switch of the DC-DC converter to control regulation of the switch, for example to open the switch or to close the switch. As described previously, the dynamic control signals may be generated by passive circuit elements, for example by charging a capacitor based on the received first signal.

Referring to S30, a second signal based on the input signal is provided to the quasi-static supply path. The quasi-static supply path generates a quasi-static control signal based on the second signal and provides the quasi-static control signal to the output terminal of the control circuit for supplying same to the switch of the DC-DC converter. As described above, the quasi-static control signal may be generated by one or more active elements within the quasi-static supply path, for example by a bipolar transistor.

According to the above described embodiment, the dynamic control signal and the quasi-static control signal are generated based on the same input signal and the first and second signals are received in-phase by the quasi-static and dynamic supply path.

Figure 3:
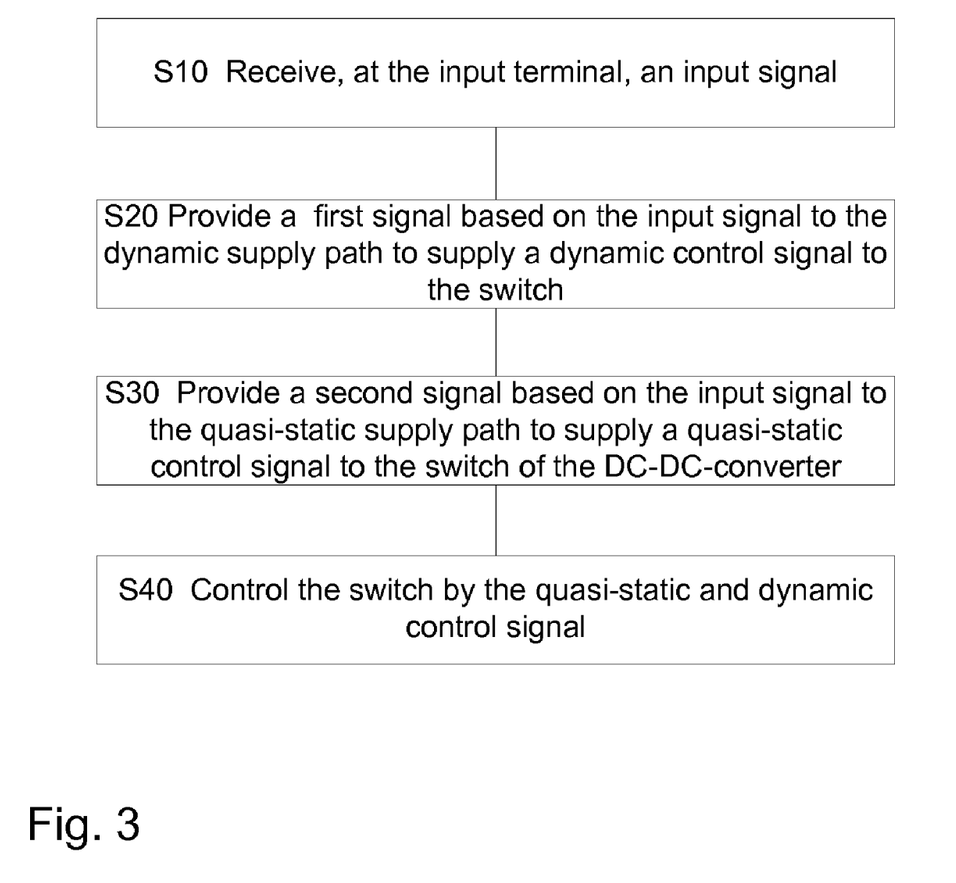
FIG. 3 shows a flow chart diagram according to an embodiment of the present invention.

While FIG. 3 describes an exemplary embodiment of operation, it is to be understood that according to other embodiments, controlling of the switch may be modified in many ways. For example, the first signal provided to the dynamic supply path and the second signal provided to the quasi-static supply path may according to one embodiment be the same signal. In other embodiments, the first and second signal may be different. In addition, a network or a voltage divider may be used in order to provide the first and second signals based on the input signal. Furthermore, the first or second signal may be processed prior to provision to the supply path, for example by filters etc.

Figure 4:
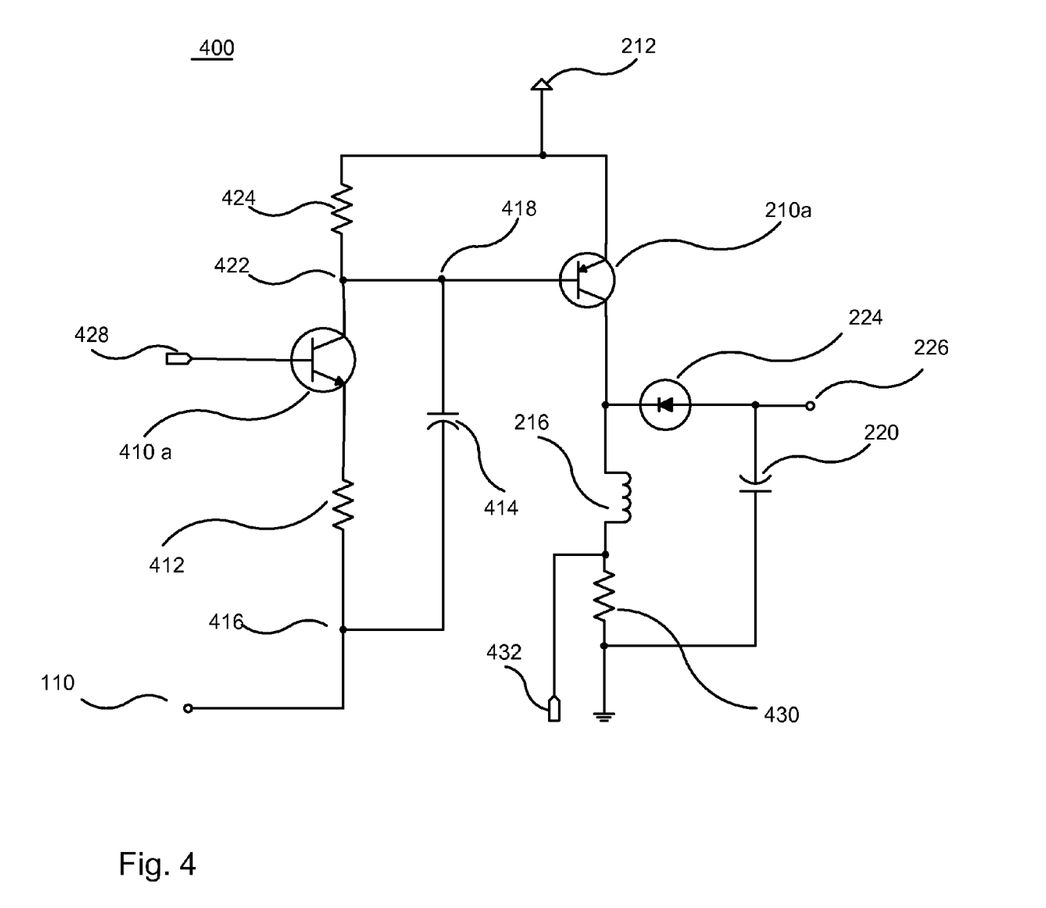
FIG. 4 shows a circuit diagram according to an embodiment of the present invention.

FIG. 4 shows according to a further embodiment of the present invention a DC-DC converter 400 of the inverting type having positive input DC-voltages. According to this embodiment, a quasi-static supply path of the control circuit comprises a npn bipolar transistor 410a and a resistor 412. The resistor 412 is coupled at a first end via a node 416 to the input terminal 110 of the control circuit. At a second end, the resistor 412 is coupled to an emitter terminal of the transistor 410a.

The dynamic supply path comprises a capacitor 414 coupled with a first electrode to node 416. A second electrode of the capacitor 414 and the collector of the transistor 410a are coupled to a node 418 which is coupled to a pnp bipolar transistor 210a acting as switch in the conversion circuit of the DC-DC converter. The collector terminal of the transistor 410a is coupled via a node 422 and a resistor 424 to the terminal 212 provided to receive the input DC voltage to be converted as described already with respect to FIG. 2. The base terminal of the transistor 410a is coupled to a terminal 428 to provide a fixed potential to the base of the transistor 410a.

The DC-DC converter 400 includes a conversion circuit comprising a diode 224, a capacitor 220 and an inductor 216 as previously described with respect to FIG. 2. Reference is made to the above detailed explanation of the elements of the conversion circuit. In addition thereto, the conversion circuit according to FIG. 4 comprises a resistor 430 provided between ground and inductor 216 to allow measurements of the current flowing through the inductor 216 in order to provide information related to the current flowing through inductor 216. These information may be used for regulating the current in order to prevent damage or degradation of inductor 216. To this end, a measurement terminal 432 is coupled to a node between the resistor 430 and the inductor 216. The measurement terminal 432 may be coupled to a control unit for controlling the duty cycle of the signals received at the input terminal 110.

In the embodiment according to FIG. 4, the bipolar transistor 410a is provided in a base circuit arrangement, i.e. the voltage at the base is maintained at a constant level by providing a constant or fixed potential at the terminal 428. According to an exemplary embodiment, a voltage of 3.3 V may be provided at the terminal. However, in other embodiments, other constant potentials may be applied to terminal 428.

In operation, the capacitor 414 and the transistor 410a provide the dynamic and quasi-static output signals based on the input signals as will be described below.

If the input signal changes from a low level, e.g. 0 V, to a high level, e.g. 3.3 V, node 416 will be driven to the high potential. The input signal is further provided via the capacitor 414 of the dynamic supply path to node 418 and the base of transistor 210a, driving the base of transistor 210a to a high potential. Based on the received signal, transistor 210a starts switching into a switched-off state wherein almost no emitter-collector current flows through switching transistor 210a.

In the quasi-static path, the emitter potential of transistor 410a is raised by the input signal resulting in a switched-off of transistor 410a. In the switched-off state, the voltage between terminals 212 and 418 drops almost entirely between collector and emitter of transistor 410a driving the base of transistor 210a to about the level of the potential applied at the terminal 212. Thus, the transistor 210a is maintained in the switched-off state by the resistor 424 in combination with the transistor 410a.

When the input signal changes from a high level to a low level, node 418 and the base of the transistor 210a is driven to a low level by capacitor 414. With the base driven to a low level, transistor 210a begins to switch on. In the quasi-static path, the emitter is driven by the input signal to a low potential and transistor 410a is switched on. The base of transistor 210a is further driven by transistor 410a to a low potential maintaining the transistor 210a in its switched-on state.

It is to be recognized that in the above described circuit, the capacitor 414 provides a dynamic switching on and switched off of the transistor 210a by applying switching signals very fast to the base of transistor 210a while the transistor 410a provides the driving force to then keep the transistor 210a in the same state for a quasi-static time-interval.

Figure 5:
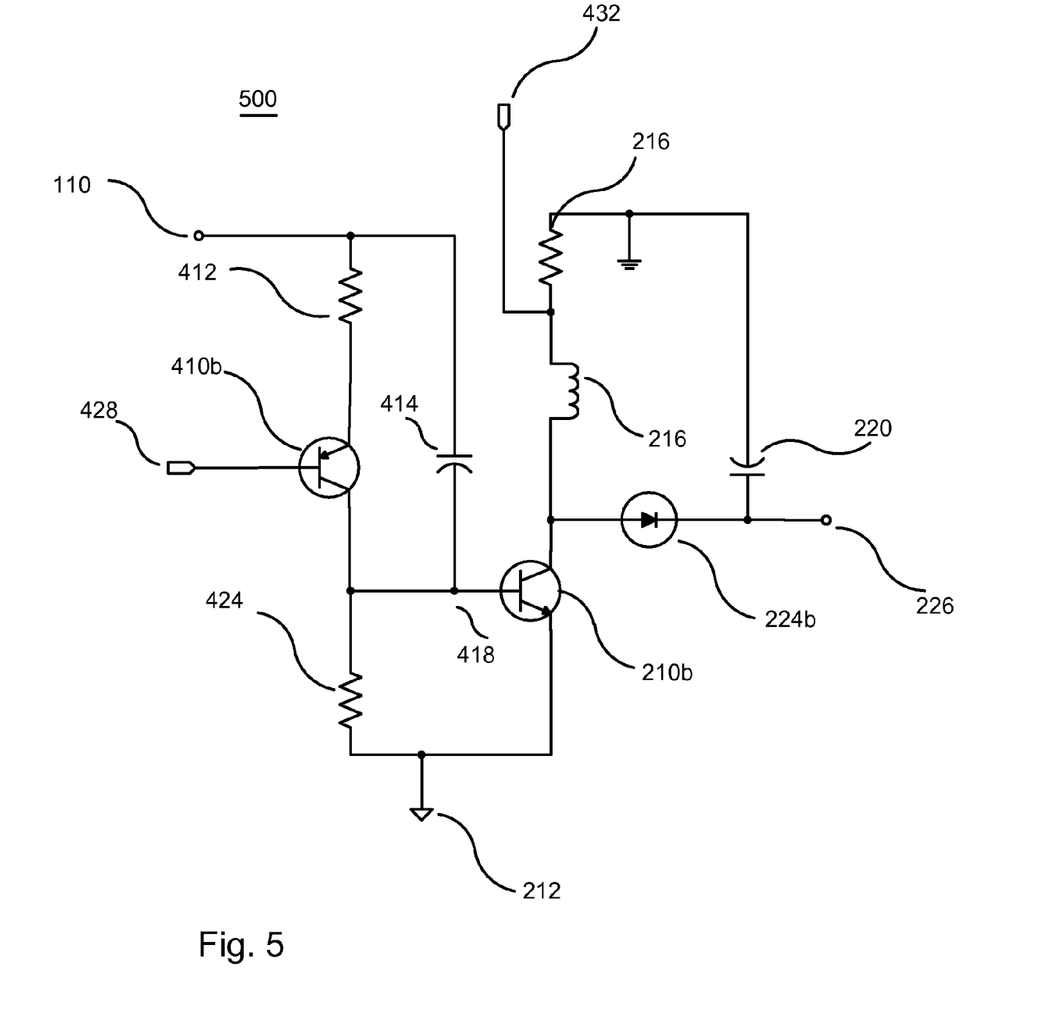
FIG. 5 shows a circuit diagram according to an embodiment of the present invention.

A further embodiment of a control circuit and a DC-DC converter 500 will be now described with respect to FIG. 5.

While the DC-DC converter according to FIG. 4 is of an inverting type having a positive input voltage, the DC-DC converter according to FIG. 5 is of an inverting type having a negative input voltage. Thus, the DC-DC converter 500 shown in FIG. 5 may be regarded as a complementary circuit of the DC-DC converter according to FIG. 4.

It is to be noted that in the control circuit according to FIG. 5, a pnp transistor 410b is provided replacing the npn transistor 410a of the control circuit according to FIG. 4. Furthermore, in the conversion circuit of the DC-DC converter 500, diode 224b is provided between inductor 216 and capacitor 220 in the reverse direction compared to diode 224 according to FIG. 4 and pnp transistor 210a is replaced by npn transistor 210b.

The control circuit according to FIG. 5 operates in a similar manner but with reversed voltages as already described above with respect to FIG. 4. Upon transition of the input signal to a low level, node 418 and the base of transistor 210b is driven by capacitor 414 to a low potential. Transistor 210b is switched-off blocking now flow of current from the ground to the DC input terminal 212.

In the quasi-static path, transistor 410b is driven by the low level input signal applied to input terminal 110 to a switched-off state. In the switched-off state, output node 418 is driven by transistor 410b to approximately the potential applied at terminal 212 driving the bipolar switching transistor 210b in the switched-off state until the input signal applied to input terminal 110 changes from the low level to the high level.

Upon changing to the high level, the input signal applied by capacitor to the output node 418 of the control circuit switches transistor 210b into a switched-on state. In the quasi-static path, the transistor 410b is switched-on and provides the driving force at output node 418 to maintain transistor 210b in the switched-on state.

It is to be noted that other embodiments encompass modifications of the DC-DC converter 500. For example, according to one embodiment, inductor 216 may be replaced by a diode while diode 224b may be replaced by an inductor to provide a non-inverting down converter converting a negative input DC voltage into a negative output voltage.

Figure 6:
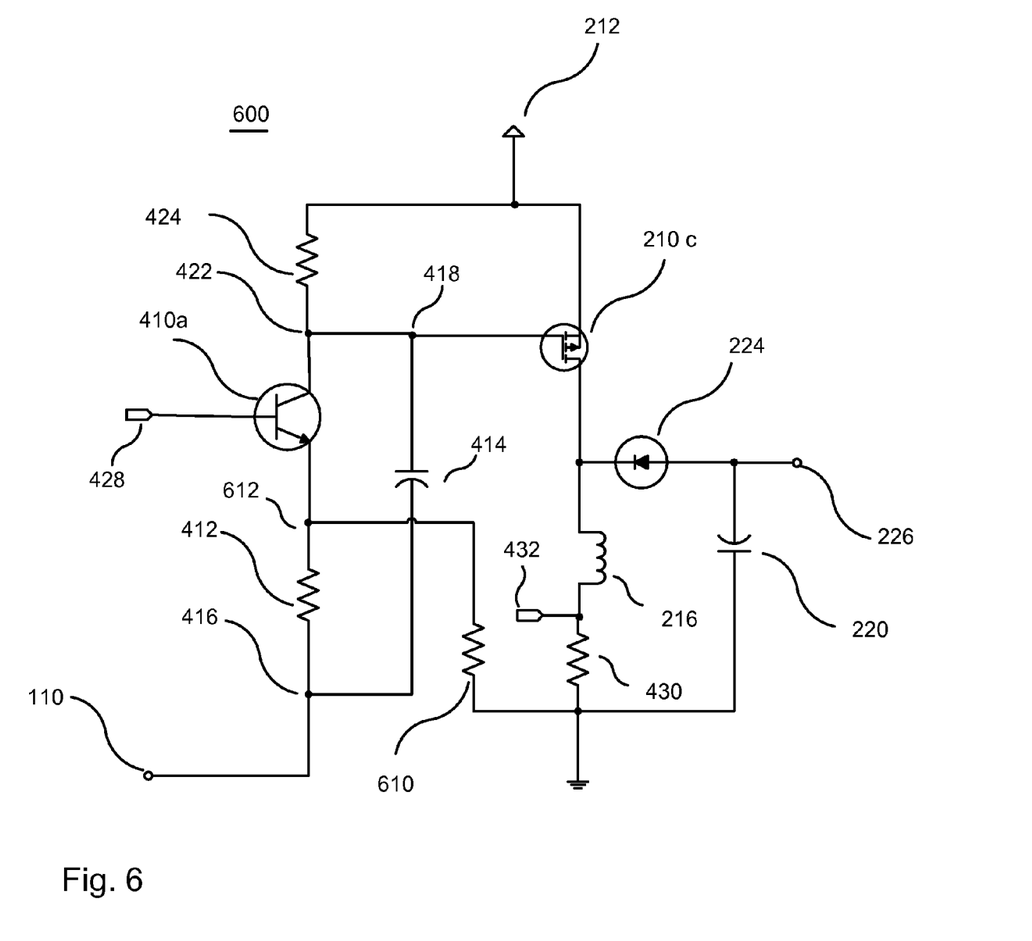
FIG. 6 shows a circuit diagram according to an embodiment of the present invention.

Referring now to FIG. 6, a DC-DC converter 600 is shown as a further embodiment. The control circuit of the DC-DC converter 600 is similar to the control circuit as described with respect to FIG. 4. Distinguished from the embodiment according to FIG. 4, in the DC-DC converter 600 a resistor 610 is coupled between ground and a node 612 between transistor 410a and resistor 412. Furthermore, in the conversion circuit, bipolar transistor 210a is replaced by a MOS transistor 210c.

Resistor 610 prevents transistor 410a to be entirely switched-off, when the input signal is at a high level. Resistor 610 and resistor 412 act as a voltage divider dividing at node 612 the voltage between output terminal 418 and ground. Thus, by tailoring the value of resistors 412 and 610, the potential at node 612 can be established to have at the high level of the input signal a predetermined value less than the potential applied to terminal 428, when the signal applied to output terminal 116 is at a high level. For example, according to an exemplary embodiment, the values of resistors 610 and 412 may be designed to have at node 612 a potential of 0.2 V less than the potential at terminal 428, when the signal at output terminal 116 is at a high level. It is to be noted that the above value of 0.5 V is only exemplary and may be according to other embodiments replaced by any other value.

By preventing the transistor 410a from fully switching-off, the control circuit in the embodiment according to FIG. 6 provides a very dynamic switching, i.e. when the input signal at terminal 110 changes from the high level to a low level, transistor 410 reaches its operation point in a shorter time interval compared to entirely switched-off transistors.

It is to be noted that in other embodiments, the prevention of an entirely switching-off of transistor 410a may be accomplished by implementation of other network elements or combinations of other network elements, for example by a diode or combinations of a resistor and a diode.

In addition, the above explained resistor 610 may be implemented in other embodiments to provide a more dynamic switching of the transistors of the control circuit. For example, resistors 412 and 610 may be provided in the embodiments described with respect to FIGS. 4 and 5 for providing the functionality described above.

Furthermore, distinguished from the embodiments according to FIGS. 3 to 5, the MOS transistor 210c is provided in the embodiment according to FIG. 6 for switching the current provided to inductor 216 in the conversion circuit. To be more specific, in the embodiment shown in FIG. 6, the MOS transistor 210c is of the enhancement type with a p-channel. Other embodiments may provide other transistors such as n-channel MOS-transistors or MOS-transistors of the depletion type.

By providing resistor 610, the threshold for switching MOS transistor 210c from the switched-off state in the switched-on state may be lowered. To be more specific, the resistor 610 and the resitors 412 and 424 may be designed to provide in the switched-off state the gate-source voltage $V_{GS\_off}$ of the MOS transistor 210c just below the threshold voltage $V_{Th}$. The threshold voltage are typically determined by the design and process parameters and therefore known or guaranteed. For example, in an exemplary implementation, the gate source-voltage $V_{GS\_off}$ may be provided to be 1V. Then, when the input terminal 110 receives the signal indicating to switch MOS transistor 210c on, the MOS transistor 210c is switched on faster compared to an operation where the gate source voltage of MOS transistor 210c is provided to be lower than 1 V, for example 0V. Furthermore, while the relative signal swing at the output of the control circuit, i.e. at node 418, is the same for the embodiments according to FIG. 4 and FIG. 6, the maximum gate source voltage which is applied in the switched on state of the MOS transistor 210c is increased by $V_{GS\_off}$ compared to when the control circuit according to FIG. 4 is provided for switching MOS transistor 210c, the later providing in the switched-off state a gate-source voltage of 0 V to the MOS transistor 210c. For example, if the relative signal swing at the output of the control circuit, i.e. the signal swing at node 418, is $V_S$, the gate-source voltage in the on-state $V_{GS\_on}$ is equal to $V_S+V_{GS\_off}$. Assuming for example $V_{GS\_off}=1V$ and $V_S=3.3V$, $V_{GS\_off}$ would be determined to be 1V+3.3 V=4.3 V. It is to be noted that according to other embodiments, other values for are $V_s+V_{GS\_off}$ may be provided. The increased gate-source voltage in the switched-on state according to the embodiment of FIG. 6 results in a decrease of the switched-on resistance $R_{on}$ of the MOS transistor 210c reducing the power consumption of the circuit in the switched on-state while the power loss due to capacitance effects are almost the same since the relative swing is identical.

While the implementation of a MOS transistor has been described with respect to FIG. 6, it is to be noted that the MOS-transistor 210c may be also implemented in other embodiments including the embodiments described with respect to FIGS. 3 to 5. Furthermore, the control circuit described in FIG. 6 may also be implemented in other embodiments including the embodiments shown in FIGS. 3 to 5.

Furthermore, while the described exemplary embodiments comprise one switch and one inductor in the conversion circuit, it is to be understood that other embodiments may comprise two or more switches and/or two or more inductors voltages in the conversion circuits.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A switching control circuit for a DC-DC converter comprising:
   an input terminal to receive input signals;
   an output terminal to couple the switching control circuit to a control terminal of a switch of the DC-DC converter;
   a quasi-static supply path coupled to the input terminal to receive first signals based on the input signals and coupled to the output terminal to provide output signals to the output terminal based on the input signals; and
   a dynamic supply path coupled to the input terminal to receive second signals based on the input signals in-phase with the first signals and coupled to the output terminal to provide output signals to the output terminal based on the input signals.

2. The switching control circuit according to claim 1, wherein the dynamic and quasi-static supply paths are connected parallel to each other.

3. The switching control circuit according to claim 1, wherein the quasi-static supply path comprises a transistor.

4. The switching control circuit according to claim 3, wherein the transistor is a bipolar transistor comprising a base terminal coupled to a fixed potential terminal.

5. The switching control circuit according to claim 1, wherein the dynamic supply path comprises only passive elements.

6. The switching control circuit according to claim 4, wherein the dynamic supply path comprises a capacitor, the capacitor comprising a first electrode connected to the input terminal and a second electrode connected to the output terminal.

7. The switching control circuit according to claim 1, wherein the input terminal is a single pin.

8. The switching control circuit according to claim 6, wherein a first resistor is coupled between the input terminal and a further first terminal of the bipolar transistor.

9. The switching control circuit according to claim 8, wherein the first electrode and the input terminal are coupled to a first node, the first resistor is provided between the first node and a second node and a second resistor is provided between the second node and a first common potential terminal to provide a first potential.

10. The switching control circuit according to claim 9, wherein the output terminal, the second electrode and a further second terminal of the bipolar transistor are coupled to a third node, and wherein a third resistor is provided between the third node and a second common potential terminal to provide a second potential.

11. A control circuit within a DC-DC converter comprising:

an input terminal to receive input signals;

an output terminal to provide output signals to a switch control terminal of the switch of the DC-DC converter;

a transistor comprising a first and second terminal and a control terminal, wherein the first terminal is coupled to the input terminal and the second terminal is coupled to the output terminal; and a capacitor comprising a first electrode coupled to the input terminal and a second electrode coupled to the output terminal.

12. The circuit according to claim 11, wherein the transistor is a bipolar transistor, and wherein the control terminal is the base terminal of the bipolar transistor and the first terminal is the emitter terminal of the bipolar transistor.

13. The circuit according to claim 12, wherein the control terminal is coupled to a first fixed potential terminal.

14. The circuit according to claim 13, wherein the first electrode of the capacitor is coupled to the first terminal of the bipolar transistor and a second electrode of the capacitor is coupled to the second terminal of the bipolar transistor.

15. The circuit according to claim 14, wherein the first electrode and the input terminal are coupled to a first node and wherein a first resistor is provided between the first node and the first terminal of the transistor.

16. The circuit according to claim 15, wherein the first resistor is provided between the first node and a second node coupled to the first terminal of the transistor and wherein a second resistor is provided between the second node and a first common potential terminal to provide a first potential.

17. The circuit according to claim 16, wherein the output terminal, the second terminal of the transistor and the second electrode are coupled to a third node, and wherein a third resistor is coupled between the third node and a second common potential terminal to provide a second potential.

18. A method for controlling a switch of a DC-DC converter comprising:

receiving, at an input terminal, a driving signal from a driver;

providing the driving signal to a quasi-static supply path to supply a quasi-static control signal to the switch of the DC-DC-converter;

providing the driving signal to a dynamic supply path to supply a dynamic control signal to the switch; and controlling the switch by providing the quasi-static and dynamic control signals to a control terminal of the switch.

19. The method according to claim 18, wherein the driving signal is received at a single pin.

20. The method according to claim 18, wherein the quasi-static supply path comprises a bipolar transistor in a base circuit configuration.

21. The method according to claim 18, wherein the dynamic supply path comprises a capacitor, wherein a first electrode of the capacitor is coupled to the input terminal and a second electrode of the capacitor is coupled to the switch.

22. A DC-DC converter comprising a switch having a switch control terminal;

control circuit, the control circuit comprising:

an input terminal to receive a control signal;

a transistor comprising a first terminal, a second terminal and a control terminal, wherein the first terminal is coupled to the input terminal to receive the control signal and wherein the second terminal is coupled to the switch control terminal; and a capacitive element comprising a first electrode coupled to the input terminal and a second electrode coupled to the switch control terminal.

23. The DC-DC converter according to claim 22, wherein the transistor is a bipolar transistor, and wherein the base of the bipolar transistor is coupled to a fixed potential terminal.

24. The DC-DC converter according to claim 22, wherein the input terminal is a single pin.

25. The DC-DC converter according to claim 22, wherein the switch of the DC-DC converter is a bipolar transistor or a field-controlled transistor.

26. The DC-DC converter according to claim 22, wherein the first electrode of the capacitive element, the first terminal of the transistor and the first input terminal are coupled to a first node; and wherein a first resistor is provided between the first node and the first terminal of the transistor.

27. The DC-DC converter according to claim 26, wherein the first resistor is provided between the first node and a second node, and wherein a second resistor is provided between the second node and a first common potential terminal to provide a first potential.

28. The DC-DC converter according to claim 27, wherein the second electrode of the capacitive element, the second terminal of the transistor and a control terminal of the switch are coupled to a third node and a third resistor is coupled between the third node and a second common potential terminal to provide a second potential.

29. The DC-DC converter according to claim 28, wherein a further first terminal of the switch is coupled to the first common potential terminal and a further second terminal of the switch is coupled to the second common potential terminal.

* * * * *